United States Patent [19]

Vijan et al.

[11] Patent Number: 4,680,085
[45] Date of Patent: Jul. 14, 1987

[54] METHOD OF FORMING THIN FILM SEMICONDUCTOR DEVICES

[75] Inventors: Meera Vijan, Troy; John C. McGill, Rochester; Paul N. Day, Troy, all of Mich.

[73] Assignee: Ovonic Imaging Systems, Inc., Troy, Mich.

[21] Appl. No.: 851,756

[22] Filed: Apr. 14, 1986

[51] Int. Cl.⁴ ............... H01L 21/306; B44C 1/22; C03C 15/00; C23F 1/02
[52] U.S. Cl. .................... 156/643; 29/580; 148/1.5; 156/646; 156/649; 156/652; 156/656; 156/657; 156/659.1; 156/662; 204/192.32; 357/4; 357/56; 427/39
[58] Field of Search ............ 357/2, 4, 56, 65; 156/643, 646, 649, 652, 653, 656, 657, 659.1, 661.1, 662; 29/569 R, 571, 572, 576 R, 580, 591; 148/1.5; 427/38, 39, 86, 88; 204/192.12, 192.25, 192.32

[56] References Cited

U.S. PATENT DOCUMENTS

| 4,331,758 | 5/1982 | Luo | 156/656 X |
| 4,417,947 | 11/1983 | Pan | 156/643 |
| 4,426,407 | 1/1984 | Morin et al. | 156/656 X |
| 4,624,737 | 11/1986 | Shimbo | 156/659.1 |

Primary Examiner—William A. Powell
Attorney, Agent, or Firm—Marvin S. Siskind; Richard M. Goldman

[57] ABSTRACT

Thin film semiconductor devices such as amorphous silicon alloy p-i-n diodes and the like which utilize mesa-like semiconductor structures having vertical sidewalls are formed by a process which eliminates overhangs and neutralizes contaminants on the sidewalls that can result in short circuits or degradation of device performance. Smooth vertical sidewalls free of overhangs and voids are created by: successively depositing the desired semiconductor layers on a substrate, then depositing and patterning a top metal contact mask on the semiconductor layers, followed by removing the unwanted portions of the semiconductor layers by reactive ion etching. The disclosed reactive ion etching provides controlled vertical etching with virtually no lateral etching, thereby providing smooth sidewalls. The top metal contact mask protects the underlying semiconductor layers during the anisotropic etching process, and its edges are precisely aligned with the sidewalls of the underlying semiconductor layers that define the mesa structure when the etching is complete. The top metal contact mask which is formed by conventional deposition and patterning techniques, serves as a connection between the metal electrode which connects semiconductor layers of the mesa structure to the top metallization which is patterned to define desired interconnections. Ion damage and contaminants formed on the sidewalls during etching are removed or neutralized by contacting the sidewalls with a base solution and/or annealing the mesa structure before it is covered with an insulation layer.

74 Claims, 7 Drawing Figures

METHOD OF FORMING THIN FILM SEMICONDUCTOR DEVICES

TECHNICAL FIELD

The present invention broadly relates to very large scale integration (VSLI) processes for forming various types of noncrystalline semiconductor devices, such as, for example, diodes made from amorphous semiconductor materials, and deals more particularly with a VSLI process for forming devices of the type which include a mesa structure having substantially vertical sidewalls and which is comprised of one or more layers of deposited disordered semiconductor material. The preferred process of the present invention results in mesa structures having smooth vertical sidewalls free of overhangs which might otherwise cause voids in the device when the mesa structure is subsequently covered with an insulative layer. The present process also eliminate ion damage and neutralizes contaminants on the sidewalls which result from etching processes and can degrade device performance.

BACKGROUND ART

Many thin film, noncrystalline or amorphous semiconductor devices include, in intermediate processing stages thereof, a physical feature sometimes referred to as a mesa structure. Mesa structures may comprise one or more semiconductor layers which rise above surrounding surface features and normally are defined by steeply sloping or substantially vertical sidewalls. As used herein "steeply sloping" means sidwalls sloped more than 45 degrees from the plane of the substrate; and "substantially vertical" means sidewalls sloped more than 70 degrees from the plane of the substrate. In the past, mesa structures constructed from amorphous silicon alloys have been formed by any of several processes. One typical method of depositing such amorphous silicon alloys in one or more layers to form, for example, large area diodes (which can be subsequently patterned into many individual diodes) is by plasma-assisted chemical vapor deposition, as disclosed, for example, in U.S. Pat. Nos. 4,226,898 and 4,485,389 to S. R. Ovshinsky and M. Izu. In one prior process, a plurality of semiconductor layers are successively deposited on a substrate following which a top layer of metal is deposited. The top metal layer is then patterned using a conventional photoresist mask and etching techniques, following which the semiconductor layer is likewise patterned using a conventional photoresist mask and etching techniques, following which the semiconductor layer is likewise patterned using a larger mask. Another process for forming thin film semiconductor devices consists of depositing the semiconductor layers on a substrate, patterning the semiconductor layers with a relatively large pattern, depositing the top layer of the metal and then patterning the top metal layer with a small pattern. One of the problems associated with the previous processes involves excessive or undesired lateral etching of the sidewalls of the amorphous silicon alloy mesa structure. The lateral etching creates undercuts or voids in the sidewalls which can be subsequently filled with metallization when the top contact is deposited. Metallization within the voids causes short cicuiting and/or leakage current between the semiconductor layers, thereby resulting in performance degradation or device failure.

Another problem associated with the prior processing methods involves the fact that it is very difficult to precisely align the top metal contact with the underlying semiconductor layers which have been previously patterned so as to define the mesa structure. This misalignment results in an overhang to the top metal contact with respect to the sidewalls of the semiconductor layers. As a result of this overhang, voids are often created beneath the overhang when the layer of insulation is deposited around the mesa structure. Again, these voids may diminish the performance of the device.

The prior processes mentioned above possess several further disadvantages. For example, multiple masks are required, and the use of masks of different sizes required that the device be larger in area than is needed to achieve the desired performance. Moreover, performance of a device is reduced because of a lower ratio of the contact area to junction area and due to the fact that the area of the semiconductor layers is larger than that of the top metal layer to which they are connected.

The use of plasma or dry etching to pattern amorphous silicon film into mesa structures is known, as shown in "High Speed Contact Type Linear Sensor Array Using s-Si pin Diodes" by H. Yamamoto et al., *Extended Abstracts of 15th Conference on Solid State Devices and Materials*, 1983, pp. 205–208. This article discloses that multiple layers of amorphous silicon may be photolithographically patterned to a desired size by dry etching using $CF_4$ gas.

Directional or anisotropic etching techniques such as plasma or dry etching are well known in the art. For example, reactive ion etching (RIE) is one form of dry anisotropic etching that utilizes chemical etching enhanced by ion bombardment. RIE may be used to anisotrophically etch various materials used in fabricating semiconductor structures, as disclosed in the following exemplary United States patents:

| U.S. Pat. No. | Material(s) Etched |
| --- | --- |
| 4,432,132 | crystalline silicon |
| 4,444,617 | molysilicide and polysilicon |
| 4,444,618 | aluminum alloys |
| 4,445,966 | chromium/silicon |
| 4,450,042 | crystalline silicon |
| 4,484,978 | silicon oxide |
| 4,543,320 | silicon oxide and molybdenum |

The chemistry and processing parameters used in reactive ion etching of integrated semiconductor structures typically depends heavily upon the morphology and chemical composition of the structures to be etched, as well as desired end results, which are typically defined in terms of geometry and the electronic properties to be achieved. Accordingly, reactive ion etching techniques which work for monocrystalline silicon or polycrystalline silicon semiconductor structures are often not suitable for achieving similar results with amorphous semiconductor materials. It is to be noted that the term "amorphous", as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

One type of reactive ion etching process considered suitable for etching amorphous silicon alloy semiconductor material uses a mixture of either $CF_4$—$H_2$—$O_2$ or $CF_4$—$O_2$. In both of these mixtures the $O_2$ concentration is approximately 8% to 10%. During this process, reactive ions of fluorine and trifluoromethane ($CF_3^+$) which is positively charged are formed in an electric field at low pressure. These ions are accelerated and directed to the substrate where they displace atoms through physical displacement and chemical reactions while forming volatile byproducts. This type of etching may be performed in an ion-assisted plasma reactor wherein the substrate is place on a powered electrode. Because reactive ion etching is highly directional, lateral etching (perpendicular to the path of the ions) can be virtually eliminated if the appropriate chemistry and operating parameters are chosen.

It has been found, however, that the use of reactive ion etching employing the aforementioned plasma etch gas mixture results in the creation of contaminants on the sidewalls of the mesa structure which are believed to be of polymer nature and/or result in ion damage to such sidewalls which materially diminish the electrical performance of the thin film semiconductor device. One problem of a general nature which typically arises in any series of VLSI processing steps for large area thin film integrated microelectronic structures is maintaining the quality or desired performance characteristics of all (or as many as possible) of the individual thin film devices to be formed. In large area active matrix flat panel displays using thin film transistors, thin film diodes, or other thin film nonlinear switching devices as the switching elements at the individual pixels, and in two dimensional matrix images and in linear sensor arrays which employ such switching elements at the individual photosensors, it is typically quite important to maintain as uniform device characteristics as possible across the entire display or array. At times, processing steps which come after the formation semiconductor junctions semiconductor metal interfaces or mesa structures or the like an impair the quality of these junctions, interfaces and mesa structures. The aforementioned problems with undesired lateral etching, misalignment and leakage currents are examples of how the quality of individual devices can be impaired.

Accordingly, one object of the present invention is to provide a sequence of VLSI processing steps which minimizes the degradation in quality of the performance characteristics of individual amorphous semiconductor devices in large area thin film microelectronic structures such as those employed in active matrix displays, two dimensional matrix imaging devices and linear sensor arrays.

Another object of the present invention to provide a process for forming a thin film amorphous semiconductor device of the type having one or more semiconductor layers defining a steep sidewall which is covered with a layer of insulation, wherein voids within the insulative layer adjacent the sidewalls are eliminated.

Another object of the present invention is to provide a process as described above which results in a smooth vertical sidewall which is free of overhangs that can contribute to such voids.

A further object of the invention is to provide a process of the type mentioned above which employs anisotropic etching in order to eliminate lateral etching of the sidewalls of the mesa structure.

A further object of the invention is to provide a process as described above which neutralizes contaminants formed on the sidewalls of the mesa structure and/or repairs ion damage to such sidewalls in order to avoid current leakage between the semiconductor layers.

A further object of the invention is to provide a process as described above which utilizes reactive ion etching employing a process gas which is free of $O_2$.

Another object of the invention is to provide a process for forming a thin film semiconductor device of the type having a bottom metal electrode, one or more amorphous semiconductor layers, and a top metal electrode which are successively and continuously deposited one on top of another before any of the layers are etched into one or more desired patterns.

SUMMARY OF THE INVENTION

The present invention relates to several related methods, which are preferably used in combination, for forming thin film semiconductor devices made from disordered semiconductor materials, especially amorphous semiconductor alloys of silicon or germanium, examples of such devices being p-i-n diodes, Schottky barrier diodes, nonlinear threshold switches such as n-i-n and n-pi-n switches, and the like. The methods have particular application to those thin film semiconductor devices employing so-called mesa structures. "Mesa structure" refers to a structural or topographical feature of the device as characterized by one or more superimposed patterned semiconductor layers being elevated relative to the surrounding features of the device by the use of one or more steeply sloped or substantially vertical sidewalls. The present processes can be advantageously employed to produce the individual pixel switching elements used in large area active matrix liquid crystal displays having two or four diodes per pixel as described in U.S. patent application Ser. No. 573,004 and 675,941 respectively filed on Jan. 23, 1984 and Dec. 3, 1984. The process can also be used to produce nonlinear threshold switch devices of the type disclosed in U.S. patent application Ser. Nos. 603,852, U.S. Pat. No. 4,667,189 and 679,770 respectively filed on Apr. 25, 1984 and Dec. 10, 1984. By way of further example, the process can be used to produce n-pi-n and p-nu-p threshold devices using punch through described in U.S. patent application Ser. No. 720,767 filed Apr. 8, 1985, as well as to produce two-dimensional imaging devices of the type disclosed in U.S. patent application Ser. No. 713,928 filed Mar. 20, 1985. The disclosures of all of the aforementioned applications are incorporated by reference herein. The present process can also be employed to produce line imagers having amorphous semiconductor photodiodes for photosensors, such as those described in the aforementioned article by H. Yamamoto et al.

According to one aspect of the invention, the method may comprise the steps of depositing one or more semiconductor layers on a substrate, then forming a top contact metal mask over a portion of the semiconductor layer, followed by the step of removing the unwanted portions of the semiconductor layers around the portion protected by the mask using a source of reactive ions which etch away the unwanted portion, and wherein the mask acts to prevent etching of those portions of the semiconductor layer which underlie the mask. The etching is performed in a plasma reaction chamber in which ion bombardment is normal to the surface of the substrate, consequently, lateral etching of the semiconducter layers is eliminated and the resultant mesa structure possesses smooth sidewalls free of voids or overhangs. Moreover, the edges of the top metal contact mask are precisely aligned with the walls of the underlying semiconducter layers. It has been found that the use of $CF_4$ as the process gas during the etching, without the use of $O_2$, provides particularly acceptable results. In fact, the process requires that the plasma chamber be purged or otherwise evacuated of $O_2$ before the $CF_4$ process gas is introduced into the chamber.

According to another aspect of the invention, in order to neutralize the contamination which is believed to be organic in nature and to repair ion damage caused by reactive ion etching, the sidewalls may be contacted with a base solution such as a convenient photoresist stripper which is normally employed to strip organic photoresist materials. Alternatively, ionic damage to the side walls may be repaired and the contamination substantially neutralized by annealing the mesa structure at a prescribed temperature for a predetermined length of time or by allowing the mesa structure to sit in an ambient enviroment for a predetermined period before depositing any subsequent layer of material thereon.

Following the processing of the mesa structure to repair ion damage and neutralize contaminants on the sidewalls thereof, an insulative layer may be deposited over and around the mesa structure. This insulative layer preferably makes continuous contact with the mesa structure sidewalls, thus obviating possible voids. A via, preferably having sloped sidewalls, is then formed through insulative layer to the top metal contact mask, following which a layer of metallization is applied to the device using conventional masking and etching techniques. The remaining unetched metallization fills the via to make contact with the upper metal contact mask and forms an electrical lead which is connected to the top layer of the mesa structure. The bottom semiconductor layer of the mesa structure is connected to a bottom electrical contact lead which may be deposited on the substrate before the mesa structure is formed.

According to still another aspect of the invention, the semiconductor layers, including at least one amorphous semiconductor layer are successively and continuously deposited on the bottom metal contact electrode before the electrode is etched into a desired pattern. By this feature of the process, the semiconductor layers are deposited over the bottom electrode in its virgin state before either the semiconductor layers or the surface of such electrode possibly becomes altered by photoresists, strippers, etchants, or the like which are required to pattern the electrode into the desired geometry. The desired semiconductor layers are anisotropically etched using a source of ions which react with the semiconductor layers before the bottom electrode is etched.

These, and other aspects of the invention, and other objects and advantages thereof, will be made clear or will become apparent during the course of the following description of a preferred embodiment of the invention.

BRIEF DESCRIPTION OF THE DRAWINGS

In the drawings, wherein the reference numerals are employed to designate identical components in the various views.

DESCRIPTION OF THE PREFERRED EMBODIMENT

Figure 1:
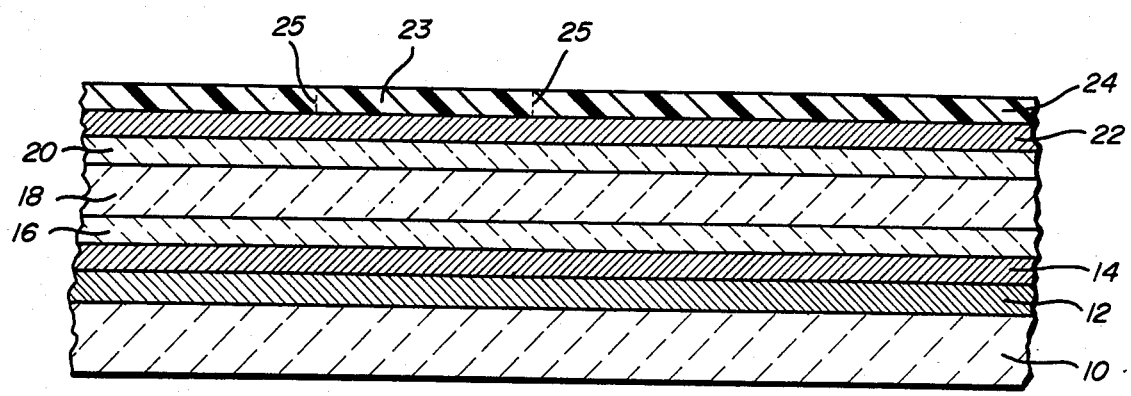
FIG. 1 is a partial cross-sectional view of partially completed amorphous silicon alloy p-i-n diode in which several preliminary steps involved in the method of the present invention have been completed, the top layer of photoresist having been exposed to subsequently form a mask over the top metal contact layer.

In connection with the detailed description which follows, the process will be described with respect to the fabrication of a typical amorphous silicon alloy p-i-n diode. It is to be understood that in practice there will typically be a few hundred to a few hundred thousand or more such devices being processed simultaneously. Typically, all such devices would be a single substrate made of glass, stainless steel, polyester, or the like. The substrates could be relatively small, such as about 2 inches (50 mm) by 2 inches (50 mm), or much larger, such as about 9 inches (225 mm) by 5 inches (125 mm), or about 7 inches (175 mm) by 11 inches (275 mm), or more. It is also to be expressly understood that the process may be effectively used to produce various other kinds of thin film devices of the type which employ mesa-like structures such as certain types of thin film transistors.

Referring now to FIG. 1, the first step in the process of the present invention involves depositing successive layers of materials on an a substrate, which may be an insulative substrate, such as the glass substrate 10. The glass substrate 10 is also exemplary of a transparent substrate which will allow the light to pass therethrough into deposited layers of semiconductor material defining a photosensitive p-i-n diode. For diode structures in display applications requiring a transmissive pixel electrode, a layer of transparent conductive oxide (TCO) 12 is deposited on the upper face of the glass substrate 10 by conventional vapor deposition techniques. The TCO layer 12, which forms a bottom conductor, preferably possesses a resistance of approximately 80 ohms per square and may comprise 300 to 1000 angstroms of indium oxide, indium tin oxide, antimony-doped indium oxide or the like. Next, a relatively thin layer 14 of protective metal such as chromium is preferably deposited on the TCO layer 12. The chromium layer 14 should be sufficiently thin to allow some reasonable percentage (e.g., fifty percent) of transmission of visible light therethrough, e.g., between about 60 to about 200 angstroms thick. In those display applications that do not require a transmissive pixel, the TCO layer 12 may be omitted. For example, in the case of a diode construction in which the substrate is opaque, the conductive layer 14 may comprise any conductive metal such as, for example, chromium, aluminum, molybdenum, molybdenum tantalum alloy, tantalum tungsten or palladium. These conductive metals may be deposited, for example, by evaporation or low power magnetron sputtering of the metal over the entire surface of the insulative glass substrate 10. The layer 12 in this construction may be 500 to 3000 angstroms thick, and are preferably 1500 to 2000 angstroms thick.

A continuous diode structure is next formed over the TCO layer 12 and the chromium layer 14 in their virgin unpatterned state by successively depositing three layers, 16, 18, 20 respectively, of noncrystalline semiconductor material, preferably an amorphous semiconductor alloy including silicon or germanium. The amorphous silicon or germanium alloy can also include hydrogen and/or fluorine and can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for "Amorphous Semiconductors Equivalent to Crystalline Semiconductors Produced by a Glow Discharge Process". The diode structure formed by layers 16, 18 and 20 preferably has a p-i-n configuration in which the first layer 16 is of a p type, the middle layer 18 is intrinsic and the top layer 20 is a second doped material which can be n type. Alternatively, however, the layers 16, 18 may be n-i-p type materials respectively. Representative thickness for the amorphous silicon alloy layers can be, for example, 300 angstroms to 1000 angstroms and preferably 500 angstroms for the p type layer 16, 1000 angstroms to 10,000 angstroms and preferably 7000 angstroms for the intrinsic layer 18 and 100 to 500 angstroms and preferably 200 angstroms for the n type layer 20. To obtain diodes having excellant electronic properties, it is strongly preferred to have an uninterrupted p-i-n deposition sequence, that is, one where the deposition chamber vacuum is not broken between layers. This uninterupted p-i-n deposition sequence ensures clean interface formation between the p and i layers and between the i and n layers.

A metal layer 22 is then deposited on top of the n type layer 20 as by electron beam evaporation or thermal evaporation of chromium. (Other metals previously mentioned with respect to layer 15 may alternatively be used for layer 22.) The chromium layer 22, which may be in the range of 1000 angstroms to 3000 angstroms thick, and is preferably on the order of 1500 angstroms thick, forms a top metal contact which protectively covers the n type layer 20, and, as will be described later, is patterned and etched to form a mask which protectively covers the underlying diode structure during subsequent etching of layers 16 through 20. In certain applications, such as imagers, the pin diode to be formed serves as a photodiode, and is illuminated from the top. Accordingly, layer 22 may also be made from a TCO material having characteristics like those previously described with respect to layer 12. Alternatively, a very thin, light transmissive, layer of chromium, for example, 60 to 200 thick angstroms, may be used instead of TCO material. It should be noted here that the drawings herein are not to scale and that the thickness of various layers illustrated in the drawings have been exaggerated to facilitate the description thereof.

Figure 2:
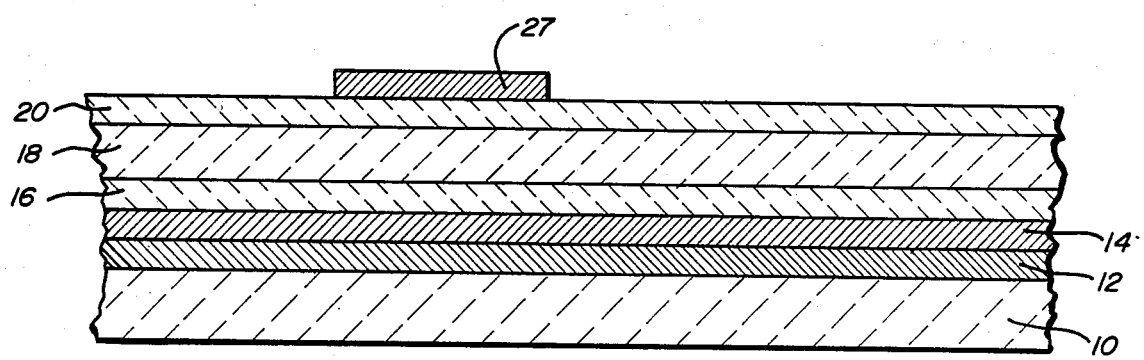
FIG. 2 depicts the next step in the process in which the top metal layer has been etched and the photoresist mask has been removed.

Having applied the top metal layer 22, a layer 24 of conventional photoresist is applied over the metal layer 22. The photoresist layer 24 is then exposed through a mask (not shown), the unexposed portion 23 of the photoresist layer 24 being indicated within the dotted lines 25. The exposed regions of the photoresist layer 24 are then removed using a conventional photoresist developer, thereby exposing portions of the metal layer 22 which are to be removed. These exposed portions of the metal layer 22 are removed using any of various conventional wet etching techniques with the unexposed photoresist layer portion 23 acting as a mask to prevent etching of portion 27 of the metal layer 22 thereunder. The patterned photoresist portion 23 which protectively covers the top metal mask 27 is preferably removed, thereby resulting in a structure shown in FIG. 2 in which a patterned metal contact portion 27 remains and the surrounding layer of metal 22 has been removed. The metal portion 27 serves as a mask, amd may be rectangular in plan. For example, mask 27 may possess dimensions of about 20 microns to 50 microns on each side.

It should be noted here that in those applications, such as line imagers which use a very thin layer of chromium for top metal layer 22, so thin that it allows light to pass therethrough to the p-i-n diode, the patterned layer of photoresist is preferably allowed to remain in order to provide additional protection for protect the underlying p-i-n structure during later-described etching.

Figure 3:
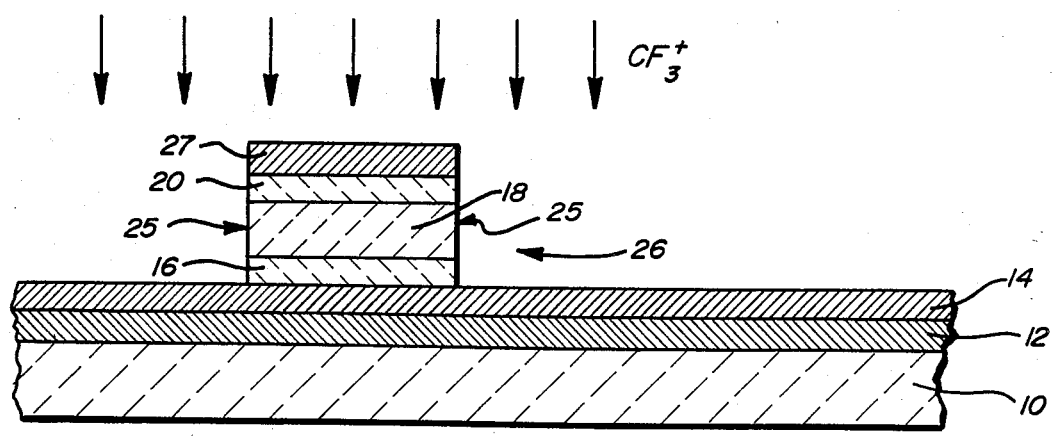
FIG. 3 depicts the next step in the process of the present invention in which the device is subjected to reactive ion etching, the direction of ion bombardment being indicated by the vertical arrows and wherein the unwanted portions of the semiconductor layers have been completely etched away to form a mesa structure.

The next step in the process is depicted in FIG. 3 in which unwanted portions of layers 16 through 20 are removed by dry etching techniques, preferably reactive ion etching (RIE). Th RIE procedure is performed by placing the substrate 10 on an RF powered electrode within a plasma reaction chamber of the conventional type available from a number of companies such as the Plasmatherm Company of Crescent, N.J. After the substrate 10 is placed in the chamber, which has a volume of about 93 liters, the chamber is pumped down to about 10 mTorr, and a neutral, preferably inert, gas such as argon is used to purge the chamber for about one minute at a flow rate of about 100 sccm, during which time the pressure in the chamber is maintained at about 75 mTorr. Next, a neutral, preferably inert, gas such as argon at this low pressure is used to generate a plasma in the chamber for approximately six minutes in order to remove any residual $O_2$ and water from the reaction chamber system. Then, the chamber is pumped down to about 1.0 mTorr before the reactive gas is introduced into the chamber in preparation for the reactive ion etching. It has been discovered that the conventional use of even small percentages of $O_2$ in combination with $CF_4$ (with or without $H_2$) as the process gases can materially reduce the electronic performance characteristics of the devices to be formed, due to the fact that the $O_2$ causes amorphous semiconductor layers, particularly the n layer 20, to be laterally etched or undercut when using reactive ion etching techniques. Even residual amounts of $O_2$ far less than 1% are harmful, particularly to an n layer of hydrogenated amorphous silicon alloy, which is typically doped with phosphorus at $10^{18}$ to $10^{21}$ atoms/cm$^3$.

Conventional $CF_4$ process gas commercially available in the United States, such as that marketed by the Linde Corporation, typically includes from 8% to 10% $O_2$ by atomic weight. This incidental amount of $O_2$ in what is known as "$CF_4$" process gas included because the oxygen beneficially reacts with the byproducts (e.g., carbon and fluorine) of the plasma reaction to form gases (e.g., $CO_2$) which are harmlessly carried away, thus allowing the reactive ion etch rate to increase. As will be discussed below, however, the abscence of $O_2$ in the $CF_4$ process gas results in the formation of contaminants, which if not removed or neutralized, will adversely affect the electrical performance of the devices being formed. We have found it preferable to purge the reaction chamber as described above with an inert gas plasma such as argon plasma in order to eliminate any residual oxygen and water (which could be a source of oxygen) before beginning the RIE step. Consequently, only substantially pure $CF_4$ process gas substantially free of all $O_2$ is utilized (e.g., $CF_4$ with 0.3% or less of $O_2$ and preferably 0.1% or less of $O_2$), and care should be taken to avoid leaks of $O_2$ or water into the process chamber so that the amount of $O_2$ in the chamber during the reactive ion etching is definitely less than 1%, such as 0.3%, and preferably is 0.1% or less. (In conventional dry etching, $H_2$ may also be used along with $CF_4$ as the process gas to achieve an anisotropic etch; a preselected profile for the sidewalls of the mesa structure may be obtained by controlling the amount of $H_2$ used in the $CF_4$ process gas). Pure $CF_4$ process gas is then introduced into the chamber at the flow rate of in the range of about 40 to about 200 sccm, and preferably approximately 100 sccm, with a DC bias on the power electrode of between −300 and −400 volts, and preferably approximately −360 volts. The power setting is approximately 750 watts and the chamber pressure is approximately 40 mTorr. The power density in the chamber is between about 0.2 and 0.5 watts/cm². The predominant chemical reaction occurring within the chamber is as follows:

$$CF_4 \rightarrow CF_3^+ + F + e^-$$

$$4F + Si \rightarrow SiF_4$$

Other halocarbon gases such as $CCl_4$ and $CBr_2$ may be used as the process gases, but also may result in cross-contamintion problems in some processing sequences since residual chlorine and bromine by-products can adversely affect subsequent photoresist or etching steps, for example. The reactive $CF_3^+$ ions from the plasma are accelerated toward the upper surfaces of the layers 20 and 22, in a direction normal to the plane of the substrate 10, due to the DC bias on the powered electrode. The bombardment of these ions results in vertical etching of the p-i-n layers 16 through 20 but causes no appreciable etching in the lateral direction. Etching is achieved by physical displacement of the atoms in the p-i-n layers 16 through 20 as well as by chemical reactions which form the gaseous volatile by-product $SiF_4$. The metal mask 27, provided it is not too thin, protectively covers the portion of the layers 16 through 20 which lie under the mask 27 during ion bombardment, consequently, a photoresist mask is normally not required. We prefer to remove the photoresist above mask 27, where possible, as a precaution against possible contamination due to the photoresist during the RIE step.

As shown in FIG. 3, the reactive ion etching removes the unwanted portions of the p-i-n layers 16 through 20 to reveal surrounding portions of the chromium layer 14, and results in a mesa structure generally indicated at 26 having smooth, substantially vertical sidewalls 25 which are precisely aligned with the outer edges of the metal mask 27. This etching technique is anisotropic and results in virtually no lateral etching of the sidewalls 25. It is believed that lateral etching is eliminated because the process gases form organic polymers on the sidewalls 25 which shield such sidewalls 25 from the reactive ions and thus lateral etching. The above-described etching procedure is preferably carried out for approximately 33 minutes at an etch rate of approximately 200 angstroms per minute, and preferably at a temperature of about 200° C. or less.

It has been discovered that the reactive ion etching technique described above usually results in some damage, apparently ion damage to the junctions between the p-i-n layers 16 through 20 at the sidewalls 25 and/or in the creation of polymer contaminants (believed to be organic in nature) which adhere to the sidewalls 25. This ion damage and/or contamination, if not eliminated or neutralized, are believed to cause above-normal leakage currents between the p-i-n layers 16 through 20, when the diode is reverse biased. Surprisingly, it has been found that annealing dramatically reduces the reverse bias leakage current due to the aforementioned contamination or damage. In accordance with the present invention, in order to eliminate the ion damage and neutralize the effects of contaminants following the etching step, the substrate 10 is annealed by placing it in an oven for at least approximately thirty minutes at a temperature of at least about 150° C. Alternatively, the ion-induced damage can be eliminated and the contaminants neutralized by allowing the substrate 10 to set in ambient conditions at ambient temperature for at least approximately 72 hours, before depositing any additional layers.

It has also been discovered that the contamination can be neutralized and the ion damage repaired by contacting the sidewalls 25 of the mesa structure 26 with a suitable organic stripper for one to two minutes at room temperature. Longer periods of contact may result in undesirable etching or undercutting of one or more amorphous semiconductor layers. One suitable stripper, which is believed to be largely a base solution and is ordinarily used as positive photoresist stripper, is manufactured by Chem-pac, Inc. of CoCo, Fla. and is designated by the manufacturer as "Chem-pac Stripper". Neutralizing the polymer contamination and repairing ion damage as described above has been found to reduce reverse bias leakage current in p-i-n diodes by as much as two or three orders of magnitude. A similar reduction in reverse bias current has been obtained by briefly treating the mesa structure with conventional wet or dry isotropic etchants of crystalline silicon following the reactive ion etching process; it is believed that such etchants, which are also capable of attacking the amorphous silicon, first tend to remove or alter the above-mentioned organic contaminants from the sidewalls of the mesa structure and repair the ion damage, before signifantly etching the amorphous silicon.

Following treatment with Chem-pac (or with conventional isotropic etchants), the mesa structure 26 is rinsed with deionized water and is subsequently dried at 120° C. for approximately three to four hours. Stripping and cleaning the mesa structure 26 described above should be carried out in a Class 1000 or better clean room since it is important to avoid contamination of the micron-sized mesa structures 26 by dust and other airborne particulates. The reactive ion etching described above is preferably performed in a Class 100 or better clean room and the coating of photoresist is preferably performed in a Class 10 or better clean room.

Figure 4:
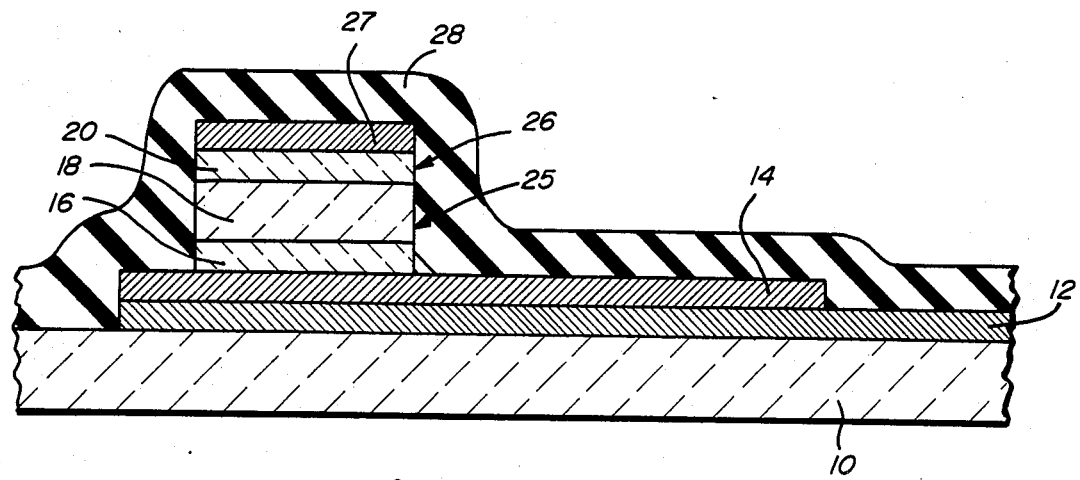
FIG. 4 depicts the next step in the process of the present invention in which a layer of insulation is deposited on and around the mesa structure.

The next step in the process involves patterning and etching the TCO layer 12 and chromium layer 14 to pattern a bottom electrical contact layer on the p-i-n diode, into a desired geometric configuration. This patterning and etching can be performed using conventional photolithography and wet etching techniques. The etched layers 12 and 14 are depicted in FIG. 4. Following etching of layers 12 and 14, a suitable insulative layer, silicon oxide ($SiO_x$), silicon nitride ($Si_xN_y$), or silicon oxynitride is applied to the top of the substrate 10 and mesa structure 26. $SiO_2$, for example, may be applied by a conventional chemical vapor deposition (CVD) process in which the process gases are disassociated in a reaction chamber and form the insulative layer 28. Low temperature CVD (e.g., 225° C. to 250° C.) must be used to avoid degrading the electronic properties of the amorphous semiconductor materials. The thickness of the insulative layer 28 may be in the range from 3500 angstroms to 1.5 microns, for example. As shown in FIG. 4, the insulative layer 28 covers the top metal contact or mask 22 and flushly conforms to the sidewalls 25 of the mesa structure 26 so as to be free of voids along the sidewalls 25.

Figure 5:
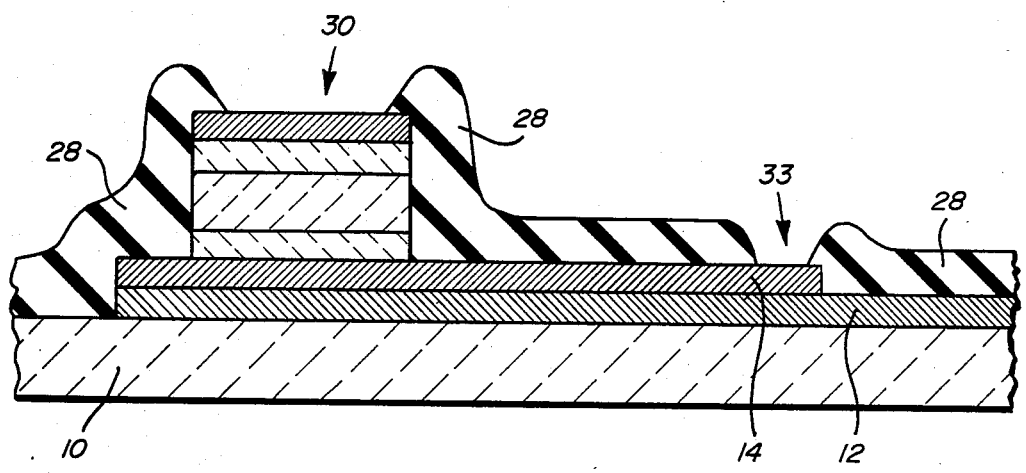
FIG. 5 depicts the next step in the process of the present invention in which vias are formed in the insulative layer.

Following the deposition of the insulative layer 28, vias 30 and 33 are formed in the insulative layer, as shown in FIG. 5. If the mesa structure 26 measures 20 microns on each side, the via 30 would be approximately 10 microns on each side at its bottom and slightly larger at its top. The vias 30, 33 respectively communicate with the top metal contact mask 22 and the bottom metal layer 14. The vias 30, 33 are formed by patterning the insulative layer 28 using conventional photolithographic techniques so that the areas overlaying the top metal contact mask 27 and bottom metal layer 14 are exposed. The substrate 10 and mesa structure 26 are then baked at approximately 120° C. for thirty minutes, following which the substrates 10 are placed in a plasma etch chamber where the exposed areas of the insulative layer 28 are etched using reactive ion etching. The process gases used in the chamber are $CF_4$ and $O_2$ which are introduced at respective flow rates 50 sccm and 5 sccm. The relative amount of $O_2$ used in the chamber determines the ratio of photoresist to $SiO_2$ etch rate. The system is operated at approximately 750 watts, at a pressure of 40 mTorr and a DC bias of $-380$ volts. These process parameters provide an etch rate of the $SiO_2$ insulative layer 28 of approximately 200 angstroms per minute. Following etching of the insulative layer 28, the photoresist is removed, resulting in the structure shown in FIG. 5.

Figure 6:
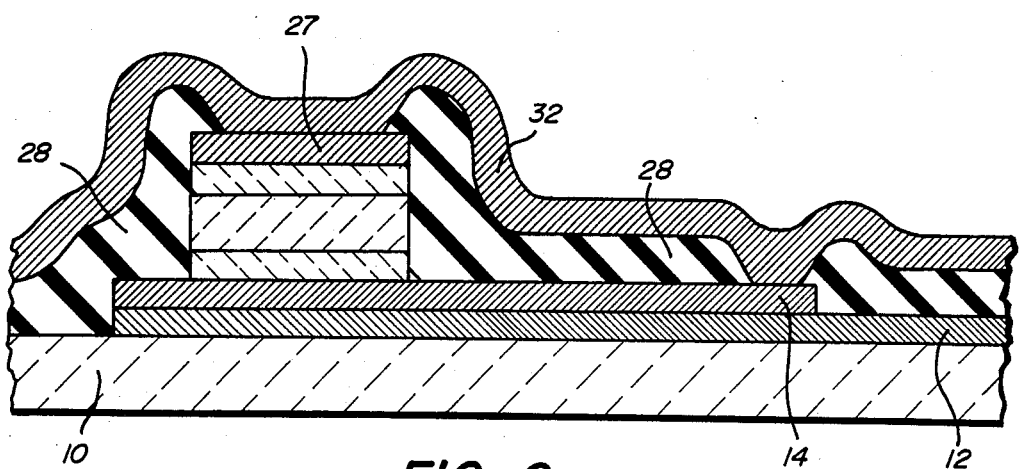
FIG. 6 depicts the next step in the process of the present invention in which a top layer of metallization is deposited which fills the vias.
Figure 7:
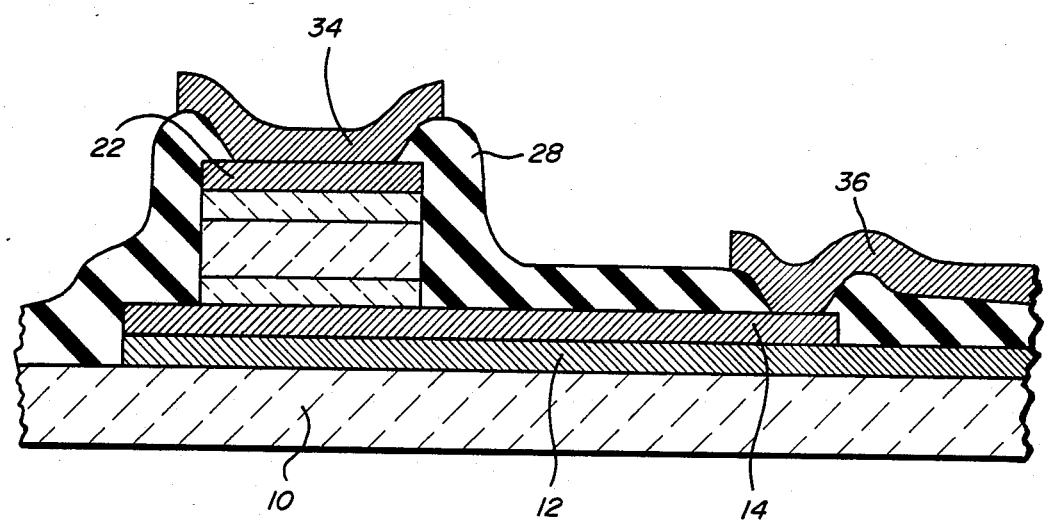
FIG. 7 depicts the last step of the process of the present invention in which the top layer of metallization has been patterned and etched to form electrically top conductive leads.

The next step in the process is depicted in FIG. 6 in which a layer 32 of conductive material, such as aluminum, molybdenum tantalum alloy or any other suitable metal, is deposited over the entire surface of the insulative layer 28 and into the vias 30, 33. The sloped sidewalls of vias 30, 33 helps assure good step coverage of top conductive layer 32. The conductive layer 32 may be deposited by magnetron sputtering and makes electrical contact with the top metal mask 27 through via 30 as well as with the patterned bottom metal layer 14 through via 32.

Selective portions of the top metal layer 32 are then removed using masking and photolithography techniques of the type well-known in the art. Removal of selective portions of the top metal layer 32 results in a pair of top metal electrical leads 34 and 36 which are respectively electrically connected to the p-i-n diode through the top and bottom metal contacts 27 and 14 respectively.

It should be noted that a number of multi layered amorphous semiconductor devices can be made with p layers and/or n layers which are microcrystalline. A p-i-n configuration employed as a solar cell, for example, wherein either the p or n layer is microcrystalline silicon, is disclosed in Japanese patent application No. 56-72193 filed May 15, 1981 and laid open to the public on Nov. 18, 1982. The methods of the present invention are well suited for processing such microcrystalline layers into, for example, mesa structures. Accordingly, if the p layer 16 and/or the n layer 20 are formed of microcrystalline semiconductor material such as silicon or germanium alloy, they could be readily etched and otherwise treated using any of the aforementioned processing steps.

Although the foregoing sequence of processed steps has been explained with respect to the construction of a single amorophous semiconductor p-i-n device, it is to be appreciated that, in practice, the processing steps will be typically carried out to simultaneously fabricate hundreds, to hundreds of thousands of like semiconductor devices on a single substrate. Accordingly, the substrate may have a very large size of 5 by 9 inches, 7 by 11 inches, or more, and all of the individual switching devices fabricated thereon may be incorporated into a single integrated device such as a liquid crystal display and/or two dimensional matrix imager, as disclosed in the previously mentioned patent applications. Since such large area substrates are often used to form a single device, it is accordingly important to have an extremely high yield. The processing steps of the present invention, particularly when used in combination, can be used to obtain such extremely high yields, which yields are typically measured in terms of the percentage of individual diodes or nonlinear switching devices which have been successfully fabricated and will operate with the desired operating characteristics. One aspect of the present invention which significantly contributes to such high yields is the fact that the bottom metal layer, the intermediate semiconductor layers, and the top metal layer are sequentially deposited one on top of the other without any intervening processing steps, i.e., the application of photoresists, strippers, etchants, or the like (which are later used to pattern the various layers into their desired configurations). Accordingly, it will be appreciated that each successive layer which is deposited makes contact with the top, virgin quality, surface of the previously formed layer, which allows a high quality interface to be formed between such layers. This helps ensure that such interfaces are not subsequently affected by the processing steps which follow except, perhaps at the sidewalls of the mesa structure, thus helping to ensure the fabrication of extremely high quality devices. The post-etching steps of contacting the sidewalls with a base solution and annealing the mesa structures serve to minimize any sidewall damage, as previously explained, which further tends to improve or at least maintain individual device quality.

Further, another important aspect of the invention which contributes to high yields is the anisotropically etching of the deposited layers of semiconductor material with a source of accelerated ions which react with the semiconductor material and produce smooth, substantially vertical, sidewalls on the resulting mesa structure, free of voids or overhangs.

Another important advantage of continuously forming or depositing all layers from the substrate up through the top metal contact layer prior to patterning is that each layer is highly uniform in thickness and quality. Since all such layers up to the top metal layer are perfectly flat (or otherwise conformed to the surface of the substrate if the substrate is non-planar), the problems of ensuring uniform step coverage over previously patterned layers is non-existent. Accordingly, the layers all have very uniform thickness and are more likely to have very uniform electronic properties, even though they have been deposited or otherwise formed over very large areas. Finally, the number of processing steps from the formation of the bottom layer to the formation of the top layer is minimized, which helps reduce to a minimum the possibility of contamination due to handling, intermediate processing steps associated with photolithography patterning, and the like.

Having thus described an embodiment of the invention, it is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of forming a thin film semiconductor device having at least one noncrystalline semiconductor layer, comprising the steps of:
   (A) depositing said noncrystalline semiconductor layer over a substrate;
   (B) forming a first conductive metal layer over first and second adjacent portions of said semiconductor layer;
   (C) removing a section of the first conductive metal layer which overlies said second portion of said semiconductor layer; and
   (D) removing the second portion of said semiconductor layer by anisotropically etching said semiconductor layer, wherein the section of the first conductive metal layer which overlies said first portion of said semiconductor layer acts as a mask to prevent vertical etching of said first portion of said semiconductor layer, said etching being performed by directing accelerated reactive ions onto the surface of said one semiconductor layer and said mask, said ions being chemically reactive with said one semiconductor layer, whereby a steeply sloping sidewall of said semiconductor layer is formed.

2. The method of claim 1, wherein said noncrystalline semiconductor layer is an amorphous semiconductor.

3. The method of claim 2, wherein step (A) is performed by depositing a plurality of amorphous semiconductor layers on said substrate before step (B) is performed.

4. The method of claim 2, wherein said reactive ions consist of $CF_3^+$.

5. The method of claim 2, wherein the direction of said reactive ions is essentially perpendicular to the plane of said substrate, whereby said first portion of said one semiconductor layer and said first conductive metal layer defining said mask form a substantially smooth sidewall which extends essentially perpendicular to said substrate plane.

6. The method of claim 2, wherein step (D) is performed by:
   introducing said substrate into a plasma reaction chamber,
   removing substantially all of the $O_2$ from said chamber, and
   introducing a $CF_4$ gas substantially free of oxygen into said chamber.

7. The method of claim 6, wherein said $CF_4$ is introduced into said chamber at approximately the rate of 40 to 200 sccm.

8. The method of claim 6, wherein said substrate is placed on an electrode in said plasma reaction chamber and said electrode is subjected to a DC bias of approximately $-300$ to $-400$ volts.

9. The method of claim 6, wherein the power density in said chamber is between approximately 0.2 and 0.5 watts/cm$^2$.

10. The method of claim 6, wherein said $O_2$ is removed from said chamber by forcing an inert gas into said chamber for a preselected length of time.

11. The method of claim 1, including the step of annealing said one semiconductor layer after step (D) has been completed.

12. The method of claim 12, wherein the annealing step is performed by subjecting said one semiconductor layer to a temperature of at least 150° C. for at least approximately thirty minutes.

13. The method of claim 6, including the step of neutralizing contamination on the sidewalls of said one portion of said semiconductor layer after step (D) is completed, said contamination resulting from the chemical reaction within said plasma reaction chamber.

14. The method of claim 13, wherein said contamination is neutralized by contacting said sidewalls with a base solution.

15. The method of claim 1, including the steps of:
   depositing an insulative layer over said first conductive metal layer and said substrate, said insulative layer covering the sides of said one portion of said semiconductor layer,
   forming a via through said insulative layer to said first conductive metal layer,
   depositing a second conductive metal layer over said insulative layer and into said via,
   removing portions of said second conductive metal layer to define a conductive lead connected to said first conductive metal layer.

16. The method of claim 1, wherein said noncrystalline semiconductor layer is an amorphous semiconductor alloy material.

17. The method of claim 16, wherein said amorphous semiconductor material is an alloy of silicon.

18. The method of claim 17, wherein said amorphous silicon alloy includes hydrogen of fluorine as a density of states reducing element.

19. The method of claim 16, wherein said amorphous semiconductor alloy material is an alloy of germanium.

20. The method of claim 19, wherein said amorphous germanium alloy material includes hydrogen or fluorine as a density of states reducing element.

21. A method of forming a thin film semiconductor device on an insulative substrate and having at least one noncrystalline semiconductor layer, comprising the steps of:

(A) forming a first electrically conductive metal layer on said substrate;

(B) depositing a plurality of semiconductor layers, including at least said one noncrystalline layer, over the first conductive metal layer formed in step (A);

(C) forming a second electrically conductive metal layer over first and second portions of the plurality of semiconductor layers deposited in step (B);

(D) removing a section of said second conductive layer which overlies the second portion of said semiconductor layers;

(E) anisotropically etching away second portion of said semiconductor layers by subjecting said second portion to a source of accelerated ions which react with said semiconductor layers to expose at least a portion of said first conductive layer; and (F) then, etching away at least part of said exposed portion of said first conductive layer to pattern said first conductive layer.

22. The method of claim 21, wherein at least one of steps (A) and (C) are performed by vapor deposition of a metal.

23. The method of claim 21, wherein step (B) is performed by depositing said plurality of semiconductor layers in a partial vacuum which is continuously maintained during the deposition of said semiconductor layers.

24. The method of claim 21, wherein said semiconductor layers are deposited by vapor deposition.

25. The method of claim 21, wherein step (B) is performed by:
depositing a first doped semiconductor layer,
depositing a substantially intrinsic semiconductor layer over said first doped semiconductor layer, and
depositing a second doped semiconductor layer over said substantially intrinsic semiconductor layer.

26. The method of claim 25, wherein said first and second doped semiconductor layers are respectively of p and n conductivity types.

27. The method of claim 25, wherein said first and second doped semiconductor layers are respectively of n and p conductivity types.

28. The method of claim 21, wherein said one noncrystalline layer is an amorphous semiconductor alloy material.

29. The method of claim 28, wherein said amorphous semiconductor material is an alloy of silicon.

30. The method of claim 29, wherein said amorphous silicon alloy includes hydrogen or fluorine as a density of states reducing element.

31. The method of claim 28, wherein said amorphous semiconductor alloy material is an alloy of germanium.

32. The method of claim 32, wherein said amorphous germanium alloy material includes hydrogen or fluorine as a density of states reducing element.

33. The method of claim 21, wherein the reactive ions consist of $CF_3^+$.

34. The method of claim 21, wherein the direction of the reactive ions is essentially perpendicular to the plane of said substrate, whereby said first portion of said semiconductor layers and said first conductive layer form a substantially smooth sidewall.

35. The method of claim 21, wherein step (E) is performed by:
introducing said substrate into a plasma reaction chamber,
removing substantially all of the $O_2$ from said chamber, and
introducing a $CF_4$ gas substantially free of $O_2$ into said chamber.

36. The method of claim 35, wheren said $CF_4$ gas is introduced into said chamber at a rate in the range of about 40 to about 200 sccm.

37. The method of claim 35, wherein said substrate is placed on an electrode in said plasma reaction chamber and said electrode is subjected to a DC bias of approximately $-300$ to $-400$ volts.

38. The method of claim 35, wherein the power density in said chamber is between 0.2 and 0.5 watts/cm$^2$.

39. The method of claim 35, wherein said $O_2$ is removed by forcing an inert gas into said chamber.

40. The method of claim 35, wherein said inert gas is argon.

41. A method of forming a thin film semiconductor device having at least a first noncrystalline semiconductor layer and including a mesa structure, comprising the steps of:

(A) depositing the first noncrystalline layer over a substrate;

(B) removing at least a first portion of said noncrystalline semiconductor layer to define a mesa structure having substantially vertical side walls, said removal being performed by subjecting said noncrystalline semiconductor layer to a source of accelerated reactive ions which anisotropically etch said first portion, wherein said reactive ion etching causes contamination to form on said side walls that would detrimentally affect at least one desired electronic characteristic of said device; and (C) neutralizing said contamination on said side walls to substantially eliminate the prospective detrimental affect.

42. The method of claim 41, wherein said noncrystalline semiconductor is an amorphous semiconductor alloy material.

43. The method of claim 42, wherein said amorphous semicondcutor material is an alloy of silicon.

44. The method of claim 43, wherein said amorphous silicon alloy includes hydrogen or fluorine as a density of states reducing element.

45. The method of claim 42, wherein said amorphous semiconductor material is an alloy of germanium.

46. The method of claim 45, wherein said amorphous germanium alloy includes hydrogen or fluorine as a density of states reducing element.

47. The method of claim 42, wherein further comprising the steps of:

(E) successively and continuously depositing a second and third amorphous semiconductor alloy layers on top of said first semiconductor layer, wherein said first and third semiconductor layers are at least moderately doped and said second layer is doped much less than said first and third layers; and (F) removing during step (B) by continuous reactive ion etching at least a first portion of the second and third semiconductor layers located vertically above the first portion of the first semiconductor layer to define said mesa structure.

48. The method of claim 41, wherein step (C) is performed by contacting said sidewalls with a base solution.

49. The method of claim 48, wherein said base solution is a photoresist stripper.

50. The method of claim 41, including the step of forming a conductive metal layer on top of said semiconductor layer before step (B) is performed, wherein said metal layer acts as a mask to protect a second portion of said semiconductor layer which forms said mesa structure from being removed by the reactive ion etching of step (B).

51. The method of claim 41, wherein step (B) is performed by using a $CF_4$ gas substantially free of oxygen as the process gas for the reactive ion etching.

52. The method of claim 51, further comprising the steps of (E) removing substantially all of the oxygen from the reaction chamber used for the reactive ion etching before beginning the reactive ion etching of the first portion of said semiconductor layer.

53. The method of claim 52, wherein step (E) is performed by purging the reaction chamber with a neutral gas which does not adversely affect the reactive ion etching of step (B).

54. A method of forming a thin film semiconductor device having at least a first noncrystalline semiconductor layer and including a mesa structure, comprising the steps of:
  (A) depositing the first noncrystalline semiconductor layer over a substrate;
  (B) removing at least a first portion of said noncrystalline semiconductor layer to define a mesa structure having substantially vertical side walls, said removal being performed by subjecting said noncrystalline semiconductor to a source of reactive ions which anisotropically etch said first portion, wherein said reactive ion etching causes damage to said sidewalls that detrimetally affects at least one desired electronic characteristic of said device; and
  (C) repairing said sidewall damage to substantially eliminate the prospective detrimental affect.

55. The method of claim 54, wherein said noncrystalline semiconductor layer is an amorphous semiconductor alloy material.

56. The method of claim 55, wherein said amorphous semiconductor material is an alloy of silicon.

57. The method of claim 56, wherein said amorphous silicon alloy includes hydrogen or fluorine as a density of states reducing element.

58. The method of claim 55, wherein said amorphous semiconductor material is an alloy of germanium.

59. The method of claim 50, wherein said amorphous germanium alloy includes hydrogen or fluroine as a density of states reducing element.

60. The method of claim 55, further comprising the steps of:
  (E) successively and continuously depositing second and third amorphous semiconductor alloy layers on top of said first semiconductor layer, wherein said first and third semiconductor layers are at least moderately doped and said second layer is much less doped than said first and third layers; and
  (F) removing during step (B) by continuous reactive ion etching at least a first portion of the second and third semiconductor layers, located vertically above the first portion of the first semiconductor layer to define said mesa structure.

61. The method of claim 54, including the step of forming a conductive metal layer on top of said semiconductor layer before step (B) is performed, wherein said metal layer acts as a mask to protect a second portion of said semiconductor layer which forms said mesa structure from being removed from the reactive ion etching of step (B).

62. The method of claim 54, wherein step (B) is performed by using $CF_4$ gas substantially free of oxygen as the process gas for the reactive ion etching.

63. The method of claim 62, further comprising the step of (E) removing substantially all of the oxygen from the reaction chamber used for the reactive ion etching before beginning the reactive ion etching of the first portion of said semiconductor layer.

64. The method of claim 63, wherein step (E) is performed by purging the reaction chamber with a neutral gas which does not adversely affect the reactive ion etching of step (B).

65. The method of claim 54, wherein step (C) is performed by subjecting said mesa structure to an elevated temperature for a preselected length of time.

66. The method of claim 65, wherein the elevated temperature is at least about 150° C.

67. The method of claim 65, wherein said preselected length of time is at least about 30 minutes.

68. The method of claim 54, wherein step (C) is performed by allowing said mesa structure to remain in an ambient environment for at least about 72 hours.

69. The method of claim 54, wherein the reactive ions consist of $CF_3+$.

70. The method of claim 46, wherein step (B) is performed by:
  introducing the substrate into a plasma reaction chamber,
  removing substantially all of the $O_2$ from said chamber, and
  introducing a $CF_4$ gas substantially free of $O_2$ into said chamber.

71. The method of claim 70, wherein said $CF_4$ is introduced into said chamber at approximately the rate of 40 to 200 sccm.

72. The method of claim 70, wherein the substrate is placed on an electrode in said plasma reaction chamber and said electrode is subjected to a DC bias of approximately $-300$ to $-400$ volts.

73. The method of claim 70, wherein the power density in said chamber is between approximately 0.2 and 0.5 watts/cm$^2$.

74. The method of claim 70, wherein said $O_2$ is removed by forming an inhert gas into said chamber for a preselected length of time.

* * * * *